United States Patent [19]

Inaba et al.

[11] Patent Number: 5,555,928

[45] Date of Patent: Sep. 17, 1996

[54] LIQUID COOLED COOLING DEVICE

[75] Inventors: Hitoshi Inaba, Machida; Tadahiro Ohmi, 1-17-301, Komegakubo 2-chome, Aoba-ku, Sendai-shi, Miyagi-ken 980, both of Japan

[73] Assignees: Tadahiro Ohmi, Miyagi-ken; Takasago Netsugaku Kogyo Kabushiki Kaisha, Tokyo, both of Japan

[21] Appl. No.: 961,936

[22] PCT Filed: Jul. 10, 1991

[86] PCT No.: PCT/JP91/00919

§ 371 Date: Jan. 4, 1993

§ 102(e) Date: Jan. 4, 1993

[87] PCT Pub. No.: WO92/01198

PCT Pub. Date: Jan. 23, 1992

[30] Foreign Application Priority Data

Jul. 10, 1990 [JP] Japan ..................... 2-181899

[51] Int. Cl.$^6$ .............. F25D 31/00; F25D 1/02; F28D 7/00; F28D 7/10

[52] U.S. Cl. .............. 165/47; 165/80.4; 165/96; 165/101; 165/169

[58] Field of Search ............... 165/168, 169, 165/46, 142, 47, 96, 80.4, 101

[56] References Cited

U.S. PATENT DOCUMENTS

| | | | |
|---|---|---|---|
| 2,277,526 | 3/1942 | Mojonnier et al. | 165/136 |
| 3,024,606 | 3/1962 | Adams et al. | 165/168 |
| 3,167,812 | 2/1965 | Von Bennigsen | 165/30 |
| 4,213,498 | 7/1980 | Vandenbossche | 165/46 |
| 4,498,446 | 2/1985 | Judson | 165/46 |
| 4,628,991 | 12/1986 | Hsiao et al. | 165/168 |
| 4,763,722 | 8/1988 | Piazzola | 165/64 |
| 5,005,640 | 4/1991 | Lapinski et al. | 165/142 |

FOREIGN PATENT DOCUMENTS

| | | | |
|---|---|---|---|
| 2023800 | 11/1971 | Germany | 165/169 |
| 31-3568 | 5/1956 | Japan . | |
| 39-1061 | 1/1964 | Japan . | |
| 50-8548 | 4/1975 | Japan . | |
| 52-30965 | 3/1977 | Japan . | |
| 56-115627 | 9/1981 | Japan . | |
| 0190289 | 8/1986 | Japan | 165/46 |
| 2-199814 | 8/1990 | Japan . | |

OTHER PUBLICATIONS

Melz, et al. "Precise Temperature Control with a Secondary Circuit Layout" 279 Kunstsoffberator 33 (1988) May No. 5 p. 42.

*Primary Examiner*—John K. Ford
*Attorney, Agent, or Firm*—Baker & Daniels

[57] ABSTRACT

A liquid cooled cooling device wherein occurrence of vibrations is controlled, the power for feeding water is lowered, and further, temperature variations around a heat generating section are prevented. The cooling device comprises: a jacket portion covering the outer peripheral portion of the heat generating section so as to surround it in order to modify the cooling liquid feeding construction and to modify the temperature conditions at flow-in and flow-out portions of the cooling liquid and the relationship between the temperature of the cooling water and the atmospheric temperature around the heat generating section and so forth, and provided at one end thereof with the flow-in portion and at the other with the flow-out portion, the said flow-in portion communicating with the flow-out portion; an insulating member covering the substantially entire peripheral portion of the jacket portion; and a temperature control means for setting the temperature of the cooling liquid flowing into the flow-in portion at a temperature lower than the atmospheric temperature in the space where the heat generating section is provided and for having the temperature of the cooling liquid flowing out of the flow-out portion coincide approximately with the atmospheric temperature.

2 Claims, 3 Drawing Sheets

US 5,555,928

LIQUID COOLED COOLING DEVICE

BACKGROUND OF THE INVENTION

FIELD OF THE INVENTION

The present invention relates to a liquid cooled cooling device which is attached to the heat generating section, for example, of a semiconductor device fabrication apparatus, and which is used for the cooling of the heat generating section using a cooling liquid such as cold water.

In, for example, a fabrication apparatus for semiconductor devices, countermeasures to the vibration and temperature accompanying an increase in the degree of integration of semiconductor integrated circuits, and furthermore, to the operating costs thereof, present difficult problems. For example, in processes for the formation of an integrated circuit with a superfine pattern on a wafer, even slight vibrations, which do not normally present a problem, can have a large adverse effect. In particular, superprecision apparatuses such as EB exposure apparatuses, which are necessary steps in the fabrication of superfine semiconductor devices, have an extremely large number of sources which generate vibration. There are various ways by which these vibrations may be propagated. In addition, the superprecision apparatus includes heat generating sections which generate a large amount of heat. A slight vibration caused by the sources that generate vibration and a change in temperature caused by the heat generating sections cause a slight variation, thermal expansion in an alignment stage, variation in the index of refraction of the optical path, etc. This can have extremely large effects on the accuracy of alignment. In addition, it is necessary to provide for heat dissipation with respect to heat generating sections, so that a cooling device is necessary.

Among such cooling devices, a device such as that shown in FIG. 7 is commonly known. In accordance with such a device, a cooling pipe RK comprising a thin metal tube which is in contact with the outer peripheral portion of the heat generating section HB, is wrapped therearound; cold water, which is used as a cooling liquid, flows into a flow-in portion LN at one end of this cooling pipe RK, and, after cooling, this cold water flows out from a flow-out portion LO at the other end of the cooling pipe RK. Here, the heat generating section HB exhibits a cylindrical form with a diameter of 300 mm and a length of 300 mm, and the cooling pipe RK is wound 15 times therearound. Accordingly, the water flow resistance of this cooling apparatus is 800 mmAq/m×14.1 m=11280 mmAq≅1.1 kg/cm$^2$.

In this case, if the temperature of the cooling liquid at the flow-in portion is represented by $T_1$, and the temperature at the flow-out portion is represented by $T_2$, it is common to set the temperatures $T_1$ and $T_2$ so that the arithmetic mean thereof is equal to the atmospheric temperature $T_0$ of the space in which the cooling device is disposed. In conventional cooling water supply systems, no attempts were made to conduct accurate control of the temperature of the cooling water, and the amount of cooling water supplied was fixed in accordance with the maximum load period.

However, in such structures in accordance with this technological background, the water flow resistance of the entire cooling water supply system exceeds, for example, 4 kg/cm$^2$, and in particular, the cooling pipe RK comprising the central part of the cooling structure comprises a continuous thin metal pipe, so that the water flow resistance within the cooling pipe RK exceeds 1 kg/cm$^2$, so that problems occur, such as difficulties in suppressing the generation of slight vibration, increases in operating costs of devices including cooling devices accompanying an increase in water flow resistance, and in water supply force, and the fact that a temperature gradient develops over the large range between the flow-in portion LN and the flow-out portion LO of the cooling pipe RK; that is to say, a thermal load distribution is produced in the portion to be cooled, and this causes temperature fluctuations toward the periphery thereof.

For example, about the time of the initiation of cooling water supply to the heat generating section of an EB exposure apparatus, when measurements were made with respect to vibration generation (measurements of the Gal value over time) in the case in which a conventional cooling device was used, it was determined that large detrimental vibration was generated in all directions (2 directions mutually perpendicular within the surface on which the device was disposed, and the direction perpendicular to this surface), particularly after the initiation of cooling water supply.

Among conventional cooling water supply systems, the pressure loss is particularly large in cases in which the water flow resistance of the cooling device is at high pressure (approximately 1 kg/cm$^2$), so that a correspondingly large amount of energy is transformed into another type of energy, that is to say, vibrational energy or thermal energy, so that this represents a source of vibration generation.

Furthermore, the heat generating section, which is the section to be cooled in conventional cooling devices, has a temperature distribution which varies with the heat generating state, so that this represents a cause of variances in the atmospheric temperature at the periphery of the device.

The present invention solves the problems present in the technological background which were listed above; it is an object thereof to provide a liquid cooled cooling device which is capable of realizing suppression of vibration generation, a reduction of water supply force, and furthermore, the prevention of variation in temperature at the periphery of the heat generating section.

SUMMARY OF THE INVENTION

In order to attain the above object, the invention has an improved cooling liquid flow structure, has improvements to the temperature conditions of the flow-in portion and flow-out portions of the cooling liquid, and to the relationship between the temperature of the cooling liquid and the atmospheric temperature at the periphery of the heat generating section, and is characterized in that it is provided with a jacket portion covering the outer peripheral portion of the heat generating section having formed at one end thereof a flow-in portion of the cooling liquid and having formed at the other end thereof a flow-out portion of the cooling liquid, the flow-in portion communicating with the flow-out portion, an insulating member covering substantially the entire peripheral portion of the jacket portion, and a temperature control means for setting the temperature of the cooling liquid flowing into the flow-in portion to a temperature lower than the atmospheric temperature in the space where the heat generating section is provided and for having the temperature of the cooling liquid flowing out of the flow-out portion coincide approximately with the atmospheric temperature.

The invention more thoroughly standardizes the temperature distribution of the jacket portion; it is characterized in that the jacket portion is provided with a flow diverting mechanism for guiding the cooling liquid flowing from the flow-in portion substantially evenly along the outer circumferential portion of the heat generating section in the direction of the flow-out portion.

The invention makes possible the elimination of the insulating members; it is characterized by being provided with a double jacket portion covering the outer peripheral portion of the heat generating section, comprising an inner portion and an outer portion which communicate, at an end of which inner portion a flow-in portion for cooling liquid is formed, at an end of which outer portion a flow-out portion for cooling liquid is formed, and wherein the flow directions of the cooling liquid flowing in the inner portion and outer portion differ, and a temperature control mechanism for setting the temperature of the cooling liquid flowing into the flow-in portion at a temperature lower than the atmospheric temperature in the space where the heat generating section is provided and for having the temperature of the cooling liquid flowing out of the flow-out portion coincide approximately with the atmospheric temperature.

The invention further standardizes the temperature distribution of the jacket portion; it is characterized in that the double jacket portion is provided at the inner portion thereof with a flow diverting mechanism for guiding the cooling liquid flowing from the flow-in portion substantially evenly along the outer peripheral portion of the heat generating section in the direction of the flow-out portion.

According to the present invention, the outer circumferential portion of the heat generating section is covered by the jacket portion, so that the flow surface area of the cooling liquid is large, and furthermore, the temperature difference between the flow-in portion and flow-out portion of the cooling liquid becomes large as a result of the temperature control mechanism, and the flow amount of the cooling liquid becomes small, so that the flow resistance of the cooling liquid is reduced. Furthermore, the jacket portion is covered by the insulating member, so that heat flow between the heat generating section and the outer portion is reduced, and temperature fluctuations around the jacket portion are prevented.

In the structure according to the present invention, a flow diverting mechanism is provided in the jacket portion of the structure described above, so that the temperature distribution of the jacket portion becomes equalized, and the prevention of temperature fluctuation around the jacket portion is more efficiently conducted.

In the present invention, the jacket portion is formed with a double walled structure at the outer circumferential portion of the heat generating section, so that the outer jacket portion exhibits insulating effects with respect to the inner jacket portion, and heat flow between the heat generating section and the outer portion is reduced.

In the present invention, a flow diverting mechanism is provided in the jacket portion of the structure described above, so that an equalization of the temperature distribution of the jacket portion can be more efficiently realized.

DESCRIPTION OF THE PREFERRED EMBODIMENTS

Hereinbelow, a preferred embodiment of the present invention will be explained with reference to the drawings. In the present preferred embodiment, water was used as the cooling liquid; however, identical effects are obtainable when other liquids are used.

Figure 3:
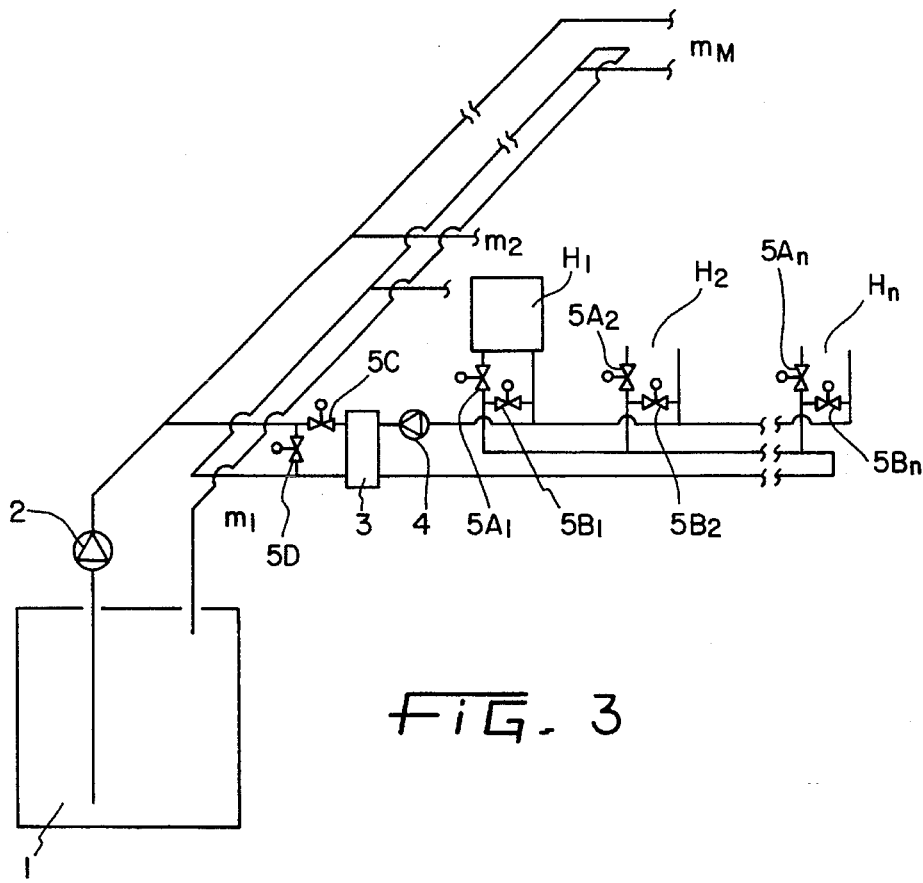
FIG. 3 is a block diagram showing an example of a cooling system to which a cooling device in accordance with the present invention has been applied.

FIG. 3 shows an example of a cooling liquid supply system to which the liquid cooled cooling device in accordance with the present invention has been applied; this cooling water supply system has a structure containing a water tank 1 for storing cold water, wherein cold water pumped up by a main pump 2 is supplied to branch cooling systems $m_1, m_2, \ldots m_M$. The cold water supplied to these branch cooling systems $m_1, m_2, \ldots m_M$ is supplied through the medium of heat exchanger 3 and water supply pump 4 to each section which is to be cooled of each apparatus $H_1, H_2, \ldots H_n$. Here, for the piping system of the cooling water supply system, a so-called "countercurrent" type was adopted, so that the passage length of the cold water in each section to be cooled was standardized. Furthermore, flow control valves $5A_1, 5A_2, \ldots, 5A_n$ were provided in the water supply pipes in the vicinity of the heat generating sections of each device (each apparatus for semiconductor device fabrication) $H_1, H_2, \ldots H_n$, the amount of water supplied to each heat generating section was adjusted in accordance with the voltage used for each apparatus $H_1, H_2, \ldots H_n$, and the water temperature of the cooling water was controlled so as to have a fixed value during normal operation. Furthermore, bypass valves $5B_1, 5B_2, \ldots, 5B_n$, which open during the interruption of water supplied to the heat generating sections, were provided between the water flow side pipes and the water return side pipes, and flow control valve 5C and bypass valve 5D were also provided on the cold water supply source side (the upstream side of the heat exchanger 3), and exert control in an identical manner.

Figure 1:
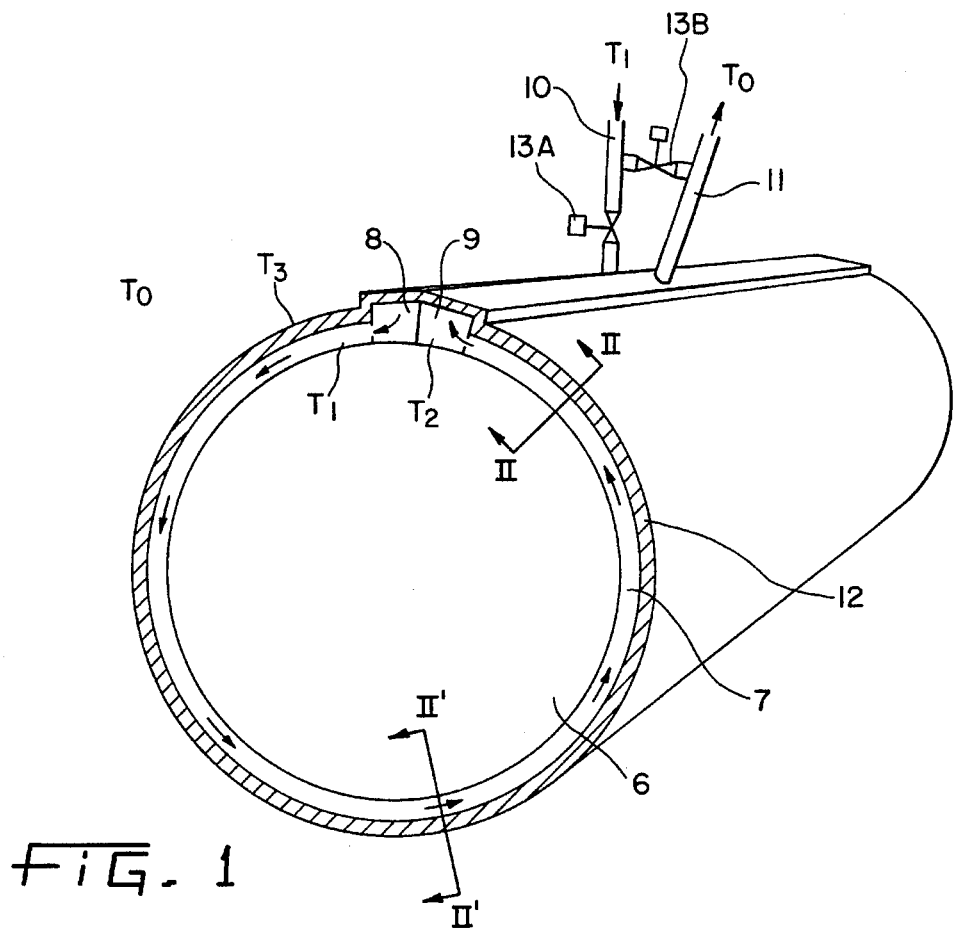
FIG. 1 is an angular view showing a first preferred embodiment of the present invention.
Figure 2A:
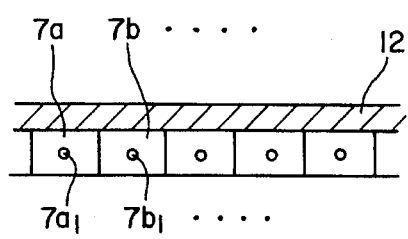
FIGS. 2(a) and 2(b) are cross sectional views taken along the lines II—II and II'—II' of FIG. 1.
Figure 2B:
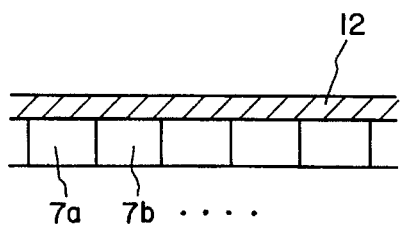

FIG. 1 illustrates a first preferred embodiment of the present invention; it has a so-called "single-layer" jacket structure. That is to say, for example, a jacket portion 7 is formed along substantially the entire surface of the outer circumferential portion of a cylindrical (for example, a diameter of 30 cm and a length of 30 cm) heat generating sections 6 and the flow of a cooling liquid is diverted to the interior of this jacket portion 7; as shown in FIGS. 2 (a) and 2(b), this interior is divided into a plurality of water passage cells $7a, 7b, \ldots$, which run in the longitudinal direction of the flow path direction of the cooling liquid. In addition, at one end of the flow path direction of the cooling water in each cell $7a, 7b, \ldots$, small pores $7a_1, 7b_2, \ldots$, (FIG. 2 (a) shows the water return header 9 side end) are formed. Furthermore, a flow-in portion (cooling water supply header 8) for the cooling water is provided at one end of the jacket portion 7, a flow-out portion (water return header 9) of the cooling water is provided at the other end thereof, a flow-in pipe 10 is connected to substantially the center portion of the supply header 8, and a flow-out pipe 11 is connected to substantially the center portion of water return header 9. Furthermore, substantially the entire outer circumferential portion of jacket portion 7 is covered by insulating member 12, and insulating member 12 is formed, for example, with a substantially fixed thickness from a foam resin material which does not produce much waste, such as polyurethane foam. 13A is a flow control valve, 13B is a bypass valve, and both valves 13A and 13B correspond to the preceding valves $5A_1, \ldots, 5B_1, \ldots$, so that the temperature control of the cold water of the supply header 8 and return header 9 and the like is centrally controlled by the opening and closing thereof. A fixed water flow resistance is set between the cooling water supply header 8 and water return header 9 and the water passage cells $7a, 7b, \ldots$, and in cooperation with the action of the small pores $7a_1, 7b_2, \ldots$, a standard amount of cooling water flows in water passage cells $7a, 7b, \ldots$ The total water flow resistance $R_O$ is expressed as the sum of a straight pipe resistance $R_K$ and a sectional resistance $R_L$ occurring as the result of various types of obstructions (curves, branches, valves, and the like); the straight pipe resistance $R_K$ and the sectional resistance $R_L$ are given by the following formulas.

$$R_K = \lambda \times (1/d) \times (v^2/2g) \times \gamma \quad \text{mAq}$$

Here, d: pipe diameter (m)

l: pipe length (m)

v: flow speed m/s

γ: specific weight (kg/m)

λ: coefficient of pipe friction g: rate of gravitational acceleration $$R_L = \zeta \times (v^2/2g) \times \gamma \quad \text{mAq}$$

Here,

ζ: sectional resistance coefficient

Accordingly, the water flow resistance is in inverse proportion to the inner pipe diameter and is in proportion to the square of the flow speed, so that in order to reduce the water flow resistance, the cross sectional flow surface of the cooling water must be increased and the flow speed must be reduced.

Figure 4:
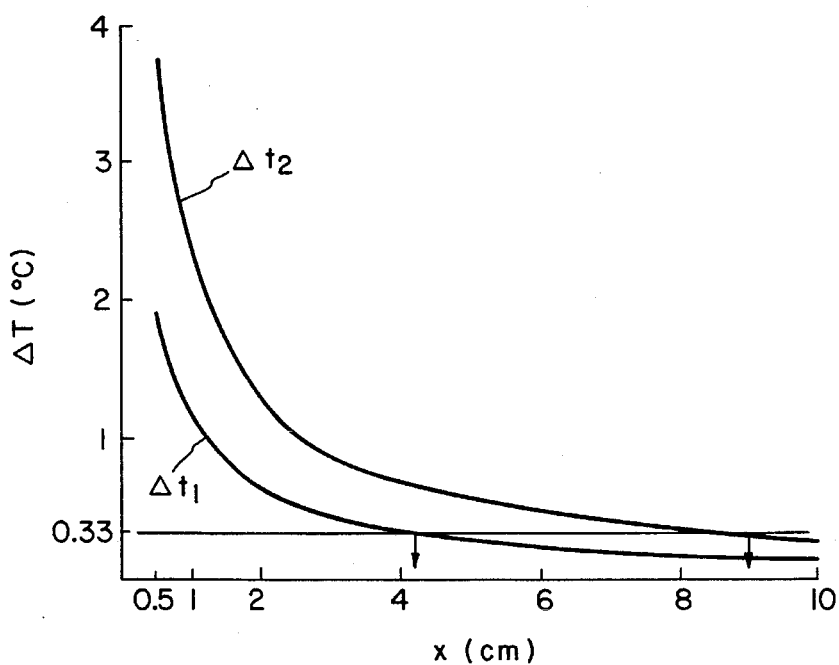
FIG. 4 is a graph showing the relationship between changes in the thickness of the insulating member and differences in temperature between the surface temperature and the atmospheric temperature.

Next, FIG. 4 is a graph showing the relationship between the temperature difference (ΔT) between a surface temperature $T_3$ of a cooling device shown in FIG. 1 and a atmospheric temperature $T_0$ around this cooling device, and a thickness X of insulating member 12; it shows the results obtained when the temperature difference (Δt) between the water temperature $T_1$ of the cooling water on the supply header side and the atmospheric temperature $T_0$ was calculated as a parameter. In the same figure, the vertical axis shows the temperature difference (ΔT ° C.), while the horizontal axis shows the thickness (X cm). Furthermore, the case in which the parameter was $\Delta t_1$ (5° C.), and the case in which the parameter was $\Delta t_2$ (10° C.), are shown.

The relational formula of ΔT and X are derived in the following manner.

If the surface temperature of the insulating member 12 covering jacket portion 7 is represented by $T_3$ ° C., the heat transmission coefficient of the insulating member 12 is represented by λ Kcal/m·h·deg, the heat transmission coefficient is represented by α Kcal/m²·h·deg, the water temperature is represented by $T_1$ 20 C., and the atmospheric temperature is represented by $T_0$ ° C., then $$\begin{aligned} \Delta T \times \alpha &= (T_0 - T_3) \times \alpha \\ &= \{(T_3 - T_1) \times \lambda\}/X \times 10^{-2} \\ &= 10^2 \{(T_3 - T_0) \times \lambda + (T_0 - T_1) \times \lambda\}/X \\ &= \{(-\Delta T + \Delta t) \times \lambda\}/X \end{aligned}$$

Here, if

λ=0.03 Kcal/m·h·deg, and

α=10 Kcal/m²·h·deg, then the relational formula $\Delta T = 3 \times \Delta t/(10 X + 3)$ is obtained.

As a result of this, in order to maintain the temperature difference (ΔT) at, for example, a level of at least 0.33° C. the thickness X of insulating member 12 must be more than 87.9 mm in the case in which the temperature difference (Δt) is $\Delta t_2$, and must be more than 42.5 mm in the case of $\Delta t_1$.

The present preferred embodiment is constructed in the above manner, so that the cooling water for heat generating section 6 flows into cooling water supply header 8, and after cooling, flows out of water return header 9; however, the cooling water is diffused within jacket portion 7 so as to flow along the outer surface of heat generating section 6, so that the water passage resistance is reduced and the water supply force is reduced. Furthermore, insulating member 12 is provided at the outer circumferential portion of jacket portion 7, so that the temperature difference between the surface of insulating member 12 and the circumferential atmosphere can be set at a very small level, and the cooling device does not create large temperature variations in its surroundings.

Next, the various functions in accordance with the structure of the present first preferred embodiment are explained hereinbelow.

The water flow resistance is, for example, set in the following manner. First, in regard to the cooling device, the water flow resistance of each water passage cell portion is set to 2 mmAq, and the water flow resistance of the 2 headers 8 and 9, each having a water flow resistance of 200 mmAq, is set to 400 mmAq, so that the total water flow resistance is set to 402 mmAq (0.04 kg/cm²). That is to say, the resistance has been reduced to approximately ¹⁄₂₅ of that of a conventional mechanism.

Next, with regard to the pipe system, 30 m of a pipe having a straight pipe resistance (15 mmAq/m) is installed, resulting in a resistance of 450 mmAq, 2 valves (corresponding to 6 m of a 15 mmAq/m pipe) are installed, having a resistance of 180 mmAq, 6 elbows (corresponding to a length of 2.5 m of a 15 mmAq/m pipe) are installed for a resistance of 225 mmAq, and the heat exchanger has a resistance of 2000 mmAq, so that the total water flow resistance is set at a level of 2855 mmAq. As a result, the total water flow resistance of the complete cooling system (the sum of the portion corresponding to the cooling device and the portion corresponding to the pipe system) has a value of 3257 mmAq≅0.33 kg/cm²; this represents ¹⁄₁₂ of the value of a conventional system.

In the present preferred embodiment, jacket portion 7 is provided, so that the cross sectional flow area of the cooling water becomes large, and furthermore, the difference in water temperature of the cooling water between flow-in portion 8 and flow-out portion 9 becomes large, and thereby, the amount of cooling water supplied decreases, and by means of this, the water flow resistance is greatly reduced.

The power of the pump used for cooling water supply is shown by the following formula (1).

Axial Power=γ×Q×H/(6120×η)KW

Q: water amount l/min

H: lift [m Aq]

γ: specific gravity of water kg/l (fixed temperature: γ=1)

η: pump efficiency motor capacity=β×axial power KW+tm (1)

β: excess percentage

β has a value of 1.15 when the motor capacity is less than 18.5 KW, and a value of 1.00 when the motor capacity is more than 22 KW.

From this formula (1), it can be seen that the water supply power of the pump is essentially in proportion to the water amount and the water supply pressure.

Accordingly, by means of a reduction in the water supply amount of the cooling water and a decrease in the water supply pressure, a large reduction in operational costs related to the cooling water supply of the cooling device can be realized. For example, by means of reducing the water supply amount to ½ of its former value and reducing the water supply pressure to ⅕ of its former value, the cooling water operational costs can be reduced to as much as 1/10 of their former value.

Figure 5:
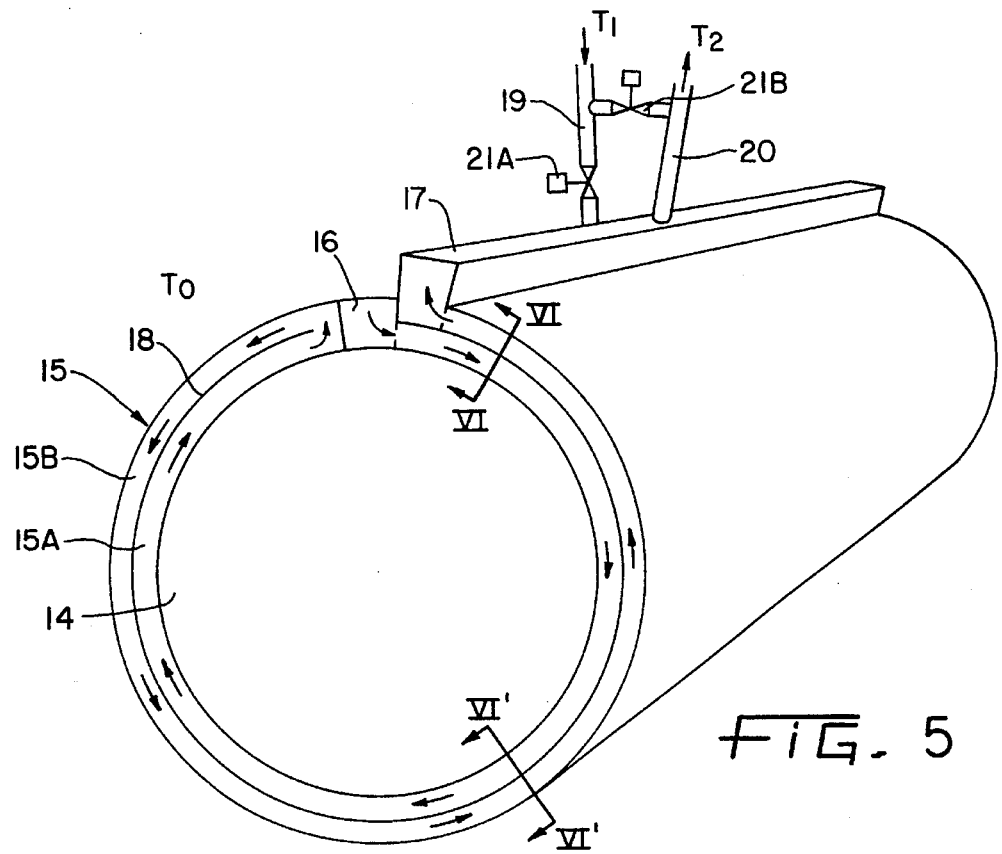
FIG. 5 is an angular view showing a second preferred embodiment of the present invention.
Figure 7:
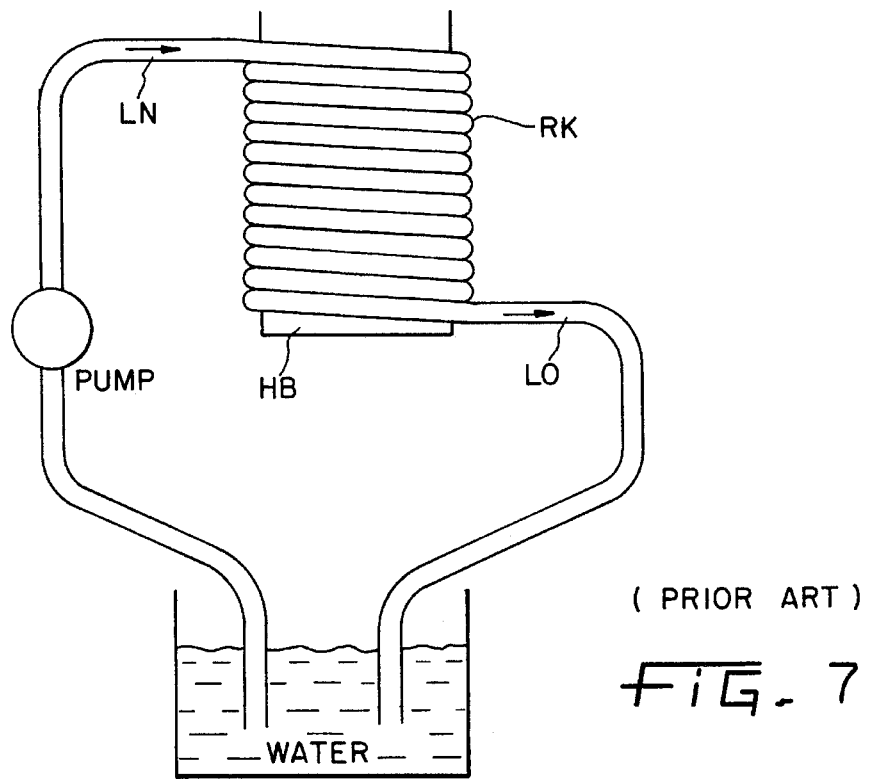
FIG. 7 is a side view showing the structure of a conventional liquid cooled cooling device.

In the present preferred embodiment, an insulating member 12 is provided at the outer circumferential portion of jacket portion 7, so that it is possible to set the temperature difference between the surface of the insulating member 12 and the surrounding atmosphere to less than 1° C., so that a cooling device in accordance with the present preferred embodiment will not become a thermal load source of temperature fluctuations in the surrounding area. Next, FIG. 5 shows a second preferred embodiment of the present invention; it has a so-called "double" jacket structure.

Figure 6A:
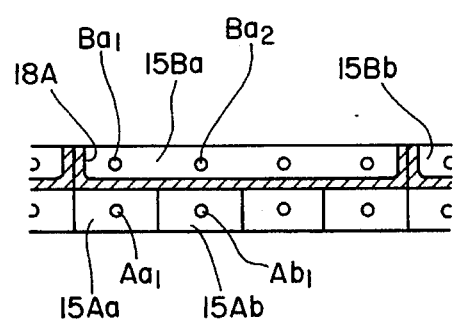
FIGS. 6(a) and 6(b) are cross sectional views taken along the lines VII—VII and VII'—VII' of FIG. 5.
Figure 6B:
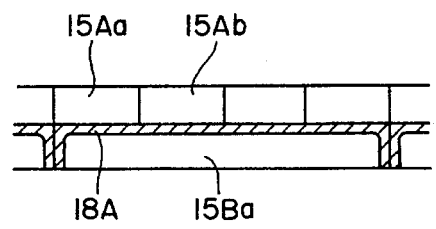

In the case of this second preferred embodiment, the double jacket portion 15 which is provided at the outer circumferential portion of heat generating section 14 comprises an inner portion 15A and an outer portion 15B; a cooling water supply header 16 is formed at one end of the inner portion 15A, and a water return header 17 is formed at an end of the outer portion 15B, and an insulating resin coating layer 18A is formed on the surface of a boundary portion 18 between inner portion 15A and outer portion 15B. Both portions 16 and 17 are in communication in the vicinity of cooling water supply header 16. Furthermore, as shown in FIGS. 6(a) and 6(b), in the same manner as in the case of the first preferred embodiment, the water passage portions of the inner portion 15A and the outer portion 15B are divided into a plurality of cells 15Aa, 15Ab, . . . , and 15Ba, 15Bb, . . . Furthermore, small pores $Ba_1$, $Ba_2$, . . . , and $Aa_1$, $Ab_1$, . . . , are formed at each end of the flow-in side and flow-out side of the cooling water in each cell. Flow-in pipe 19, flow-out pipe 20, flow amount control valve 21A, bypass valve 21B, and the like, have structures which are identical to those in the case of the first preferred embodiment.

Here, the total water flow resistance in this second preferred embodiment is set, for example, as follows.

With regard to the cooling device, the cooling water flow speed in the double jacket portion 15 is set to 0.2 m/s, the flow path length is set to approximately 2 m (2 mmAq/m) and the water flow resistance is thus 4 mmAq, and the water flow resistance of the headers 8 and 9, each having a water flow resistance of 200 mmAq, is set to 400 mmAq, so that the total water flow resistance is set to a value of 404 mmAq.

With regard to the pipe system, 30 m of a pipe having a straight pipe resistance (15 mmAq/m) is installed, resulting in a resistance of 450 mmAq, 2 valves (corresponding to 6 m of a 15 mmAq/m pipe) are installed, having a resistance of 180 mmAq, 6 elbows (corresponding to a length of 2.5 m of a 15 mmAq/m pipe) are installed for a resistance of 225 mmAq, and the heat exchanger has a resistance of 2000 mmAq, so that the total water flow resistance is set at a level of 2855 mmAq. As a result, the total water flow resistance of the complete cooling system (the sum of the portion corresponding to the cooling device and the portion corresponding to the pipe system) is extremely low, having a value of 3259 mmAq≅0.33 kg/cm².

Next, a calculation example showing the prevention of temperature fluctuation by means of this present second preferred embodiment will be explained.

If the heat generation amount $H_h$ of the heat generating section 14 is set to $H_h$=10 KW=8600 Kcal/h, the surface area $A_h$ of a heat generating section 14 having a diameter $D_h$ of 300 mm φ and a length $L_h$ of 300 mm is set to $A_h$=0.28 m², the temperature $T_1$ of the cooling water in the supply header 16 is set to $T_1$=13° C., the temperature $T_2$ of the cooling water in the water return header 17 is set to $T_2$=23° C., and the atmospheric temperature $T_0$ of the heat generating section is set to $T_0$=23° C., the flow amount Q of the cooling water (specific heat $C_H$ Kcal/1·° C.) is $$Q = H_h/C_H(T_2 - T_1)$$
$$= 8600/10 = 860 \text{ l/h}$$
$$= 14.3 \text{ l/min.}$$

The heat load resulting from the cooling water within the double jacket portion 15 results from the heat generating section 14 and can be ignored in comparison with this, so that it does not enter into the calculation.

On the other hand, when the flow speed $V_0$ of the cooling water within the double jacket portion 15 is set to 0.2 m/s and the flow amount Q and the length $L_h$ given above are used, the thickness $D_u$ of the cooling water in the double jacket portion 15 (inner portion 15A) is $$D_u = Q/60 \, V_0 \times L_h$$
$$= 14.3/60 \times 0.2 \times 0.3$$
$$= 4 \text{ mm.}$$

The average temperature difference $\Delta_0$ between the cooling water temperature of inner portion 15A of double jacket portion 15 and outer portion 15B is $\Delta_0$ (23–13)/2=5° C.

If the thermal transmission ratio λ between the inner portion 15A and the outer portion 15B of the double jacket portion 15 is set to a value of 0.2 Kcal/m·h·° C., and the thickness $t_c$ of the insulating resin coating is set to 1 mm, the amount of transferred heat $Q_p$ is $$\begin{aligned} Q_p &= -\Delta_0 \cdot \lambda \cdot A_h/t_c \\ &= -5 \times 0.2 \times 0.28/0.001 \\ &= -280 \text{ Kcal/h.} \end{aligned}$$

The temperature variation quantity $\Delta T_M$ of the cooling water is $$\begin{aligned} \Delta T_M &= Q_p/Q \\ &= 280/860 = -0.33 \text{ °C.} \end{aligned}$$

In the case of the second preferred embodiment, by means of forming the jacket portion with a double walled structure, there is no need to provide an insulating member 12 as in the first preferred embodiment, and it is possible to set the difference ($\Delta T$) between the temperature of the cooling surface of the double jacket portion 15 and the atmospheric temperature to an extremely small value. That is to say, the temperature variations resulting from the cooling device are prevented.

The vibration control and operational cost reduction functions are identical to those of the first preferred embodiment.

The invention is characterized in that it is provided with a jacket portion covering the outer peripheral portion of the heat generating section having formed at one end thereof a flow-in portion of the cooling liquid and having formed at the other end thereof a flow-out portion of the cooling liquid, the flow-in portion communicating with the flow-out portion, an insulating member covering substantially the entire peripheral portion of the jacket portion, and a temperature control means for setting the temperature of the cooling liquid flowing into the flow-in portion at a temperature lower than the atmospheric temperature in the space where the heat generating section is provided and for having the temperature of the cooling liquid flowing out of the flow-out portion coincide approximately with the atmospheric temperature; thus, the flow resistance of the cooling liquid such as cooling water can be greatly reduced, a great contribution is made to the prevention of vibrational generation, and by making the temperature difference of the cooling liquid on the supply flow side and the return flow side large, the amount of cooling liquid supplied is reduced, so that a reduction in the flow resistance and in the amount of cooling liquid supplied is possible, and as a result thereof, the flow power of the cooling liquid can be greatly reduced and a reduction in operational costs can be anticipated. Furthermore, it is possible to control the difference between the temperature of the surface of the cooling device and the atmospheric temperature surrounding this cooling device at an extremely small value on the order of, for example, less than 1° C. and it is possible to prevent fluctuations in atmospheric temperature resulting from this cooling device.

The invention has a structure wherein the jacket portion is provided with a flow diverting mechanism for guiding the cooling liquid flowing from the flow-in portion substantially evenly along the outer circumferential portion of the heat generating section in the direction of the flow-out portion side, so that in addition to the above described effects, fluctuations in atmospheric temperature can be more effectively prevented.

The invention also has a structure provided with a double jacket portion covering the outer peripheral portion of the heat generating section, comprising an inner portion and an outer portion which communicate, at an end of which inner portion a flow-in portion for cooling liquid is formed, at an end of which outer portion a flow-out portion for cooling liquid is formed, and wherein the flow directions of the cooling liquid flowing in the inner portion and outer portion differ; and a temperature control mechanism for setting the temperature of the cooling liquid flowing into the flow-in portion at a temperature lower than the atmospheric temperature in the space where the heat generating section is provided and for having the temperature of the cooling liquid flowing out of the flow-out portion coincide approximately with the atmospheric temperature; thus, this contributes to the prevention of vibrational generation and to a reduction in operational costs, and variations in atmospheric temperature resulting from the cooling device can be effectively prevented even if an insulation process is not carried out.

The invention is further characterized in that the double jacket portion is provided at the inner portion thereof with a flow diverting mechanism for guiding the cooling liquid flowing from the flow-in portion substantially evenly along the outer peripheral portion of the heat generating section in the direction of the flow-out portion, so that in addition to the effects of claim 3, fluctuations in the atmospheric temperature around the section to be cooled can be more effectively prevented.

We claim:

1. A liquid cooled cooling device for cooling a heat generating section, comprising:

a double jacket portion defining a space for locating a heat generating section and covering an outer peripheral portion of said heat generating section, said double jacket portion including an inner portion and an outer portion which are arranged in series flow communication, said inner portion comprising an inner plurality of coolant passage cells and said outer portion comprising an outer plurality of coolant passage cells, said inner and outer pluralities of coolant passage cells arranged in parallel flow communication, each said inner coolant passage cell provided with an entrance pore, each said outer coolant passage cell provided with an exit pore, a flow-in portion for coolant arranged at one end of said inner portion, and a flow-out portion for cooling liquid arranged at one end of said outer portion, the flow directions of coolant in said inner portion and said outer portion being opposite; and a flow controller valve disposed in circuit with and upstream of said flow-in portion for controlling the amount of coolant supplied to said flow-in portion whereby the temperature of coolant flowing into said flow-in portion can be caused to be lower than the atmospheric temperature in said space, and the difference between the temperature of coolant flowing out of said flow-out portion and said atmospheric temperature can be caused to be less than a predetermined amount.

2. The liquid cooled cooling device of claim 1, wherein said inner portion includes a flow diverting mechanism for guiding coolant flowing from said flow-in portion substantially evenly along the said outer peripheral portion of said heat generating section in the direction of said flow-out portion.

* * * * *